(12) United States Patent
Miya

(10) Patent No.: US 7,722,736 B2
(45) Date of Patent: *May 25, 2010

(54) APPARATUS FOR AND METHOD OF PROCESSING A SUBSTRATE WITH PROCESSING LIQUID

(75) Inventor: Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 324 days.

This patent is subject to a terminal disclaimer.

(21) Appl. No.: 11/154,363

(22) Filed: Jun. 16, 2005

(65) Prior Publication Data

US 2006/0021636 A1  Feb. 2, 2006

(30) Foreign Application Priority Data

Jul. 30, 2004  (JP)  ............................. 2004-223412

(51) Int. Cl.
B08B 3/00 (2006.01)
H01L 21/306 (2006.01)

(52) U.S. Cl. ............................ 156/345.17; 156/345.55; 134/119; 134/94.1; 134/95.1; 134/153

(58) Field of Classification Search ............ 156/345.17, 156/345.55; 134/902, 149, 119, 94.1, 95.1, 134/153; 118/730
See application file for complete search history.

(56) References Cited

U.S. PATENT DOCUMENTS

| | | | |
|---|---|---|---|
| 6,558,478 B1 | 5/2003 | Katakabe et al. | |
| 2003/0024645 A1* | 2/2003 | Orii et al. | 156/345.33 |
| 2003/0196683 A1 | 10/2003 | Izumi et al. | |
| 2004/0077159 A1 | 4/2004 | Yun et al. | |
| 2004/0084144 A1 | 5/2004 | Yokouchi et al. | |
| 2005/0276921 A1* | 12/2005 | Miya et al. | 427/240 |
| 2006/0102289 A1 | 5/2006 | Fukatsu et al. | |
| 2006/0130968 A1 | 6/2006 | Orii et al. | |
| 2007/0141951 A1* | 6/2007 | Naoki et al. | 451/5 |

(Continued)

FOREIGN PATENT DOCUMENTS

JP  2002-75953  3/2002

(Continued)

OTHER PUBLICATIONS

Computer generated English Translation of Kenichi et al JP 2003-264168 published Sep. 19, 2003.*

(Continued)

Primary Examiner—Sylvia R. MacArthur
(74) Attorney, Agent, or Firm—Ostrolenk Faber LLP (57) ABSTRACT

On the top surface of a substrate, an atmosphere blocker plate, of which plan size is equal or larger than the substrate size, is disposed opposing to the top surface of the substrate. In the rim portion of the atmosphere blocker plate, a vertical through hole is formed so that a nozzle can be inserted into the hole. Nozzle move mechanism moves the nozzle to insert the nozzle to the through hole and position it to the opposing position that is opposed to the top rim portion of the substrate and to the retract position that is away from the atmosphere blocker plate. Processing liquid is supplied from the nozzle, which is positioned to the opposing position, to the top rim portion of the substrate.

9 Claims, 8 Drawing Sheets

U.S. PATENT DOCUMENTS

2008/0035610 A1* 2/2008 Miya et al. .................. 216/84
2008/0210278 A1 9/2008 Orii et al.

FOREIGN PATENT DOCUMENTS

| | | |
|---|---|---|
| JP | 2002-176020 | 6/2002 |
| JP | 2003-45839 | 2/2003 |
| JP | 2003-264168 | 9/2003 |
| JP | 2004-6672 | 1/2004 |
| JP | 2004-55927 | 2/2004 |
| JP | 2004-140345 | 5/2004 |
| JP | 2006-140385 | 6/2006 |

OTHER PUBLICATIONS

Office Action dated Jun. 13, 2008 issued in corresponding Chinese Patent Application No. 2005-10078650.9.

Office Action issued Aug. 11, 2009 in corresponding Japanese Application No. JP2004-223412.

* cited by examiner

APPARATUS FOR AND METHOD OF PROCESSING A SUBSTRATE WITH PROCESSING LIQUID

CROSS REFERENCE TO RELATED APPLICATION

The disclosure of Japanese Patent Application No. 2004-223412 filed Jul. 30, 2004 including specification, drawings and claims is incorporated herein by reference in its entirety.

BACKGROUND OF THE INVENTION

1. Field of the Invention

The invention relates to a substrate processing apparatus for performing processing such as cleaning of various types of substrates such as semiconductor wafers, glass substrates for photo mask, glass substrates for liquid crystal display, glass substrates for plasma display and optical disk substrates by supplying a processing liquid to these substrates.

2. Description of the Relates Art

In the manufacturing process for semi conductor devices, coating of a thin metallic film such as a thin copper film is often performed on the entire top surface and edge surface (and bottom surface in some cases) of a substrate. Then, the metallic thin film is removed by etching from the portions where coating is not required. For example, when the copper thin film is used for the purpose of facilitating for wiring, the coating of copper thin film is needed only in device seating areas. Therefore, the copper thin film portions that are adhered to the rim of the top surface, bottom surface and outer edge will not be needed. Moreover, when the substrate is transported by a substrate-transporting robot that is installed in a substrate processing apparatus, the copper may adhere to contaminate the hands of the robot. When the contaminated hands come in contact with other substrates, the copper and other unwanted substances will consequently be transferred to these substrates.

For the same reasons, the processing is performed for the purpose of removing the metallic contaminant, by thinly etching a non-metallic film such as an oxidized film, a nitride film or the like that is formed on the rim of the substrate. An apparatus, which is described in the Japanese Publication of Unexamined Application 2004-6672, performs processing of the rim portion and edge surface of the substrate through selective etching. This apparatus comprises: a spin chuck that rotates the substrate while keeping it horizontal; a blocker plate that is located above the spin chuck to control the space on the top surface of the substrate; and a nozzle that supplies the processing liquid such as an etching liquid to the bottom surface of the substrate. With this apparatus, the processing liquid that is supplied to the bottom surface of the substrate flows outward from the center to the rim portion of the bottom surface of the substrate, due to the presence of centrifugal force. Then, the processing liquid flows over edge surface to reach the top rim portion. The blocker plate is disposed in adjacent to the top surface of the substrate and the inert gas such as nitrogen gas or the like is supplied to the space between the blocker plate and the substrate. By controlling the flow rate of the inert gas, the rotating speed of substrate and the supplying quantity of processing liquid at the optimum levels, the etching of the top rim portion of the substrate is selectively performed at a pre-determined width. After the unwanted substance on the top rim portion of the substrate is removed by etching, the top and bottom surfaces of the substrate are rinsed with pure water or DIW (de-ionized water). Subsequent to the rinsing process, the spin chuck is activated to spin at high speed to spin-dry the top and bottom surfaces of the substrate.

SUMMARY OF THE INVENTION

The above apparatus takes the approach of supplying the processing liquid to the bottom surface of the substrate to cause the processing liquid to flow over to the top rim portion. In the apparatus, however, the etching liquid supplied to the top surface are severely limited in quantity. Furthermore, the amount of liquid which flows over to the top surface cannot be controlled accurately. This causes poor precision of etching width with uneven width of etching created on the top rim portion of the substrate.

To ensure evenness of the etching width in the top rim portion of the substrate, the approach that can be considered is to supply the processing liquid directly to the top rim portion of the substrate, instead of supplying to the bottom surface of the substrate and cause it to flow over to the top rim portion. By supplying the processing liquid directly to the top rim portion, etching width can be controlled freely and precisely. However, in this case, since the nozzle that supplies the processing liquid to the top rim portion of the substrate will be disposed opposing to the top rim portion of the substrate, a blocker plate needs to be made smaller than the outer dimension of the substrate. If the outer dimension of the blocker plate is made smaller than that of the substrate, the space between the top surface of the substrate and a blocker plate will consequently become smaller. The atmosphere of the etching liquid that develops outside the space or, the mist of the processing liquid that is generated during the processing process may enter the device seating area (non-processed area) on the central portion of the top surface of the substrate. Such symptom of the entry of the mist and atmosphere causes corrosion in the devise seating area. Further, inability to sufficiently manage the atmosphere between the top rim portion of the substrate and the blocker plate during spin-drying process of the pure water or DIW causes the outside atmosphere to be sucked in, thereby leaving damages such as a water marking on the surface of the substrate, which may possibly result in defective drying of the substrate.

The primary object of this invention is to perform even processing of the top rim portion of the substrate in uniform width, while preventing the adhesion of the processing liquid to the central portion of the substrate, in the substrate processing apparatus that is designed to perform pre-determined processing to the substrate by supplying the processing liquid to the substrate while rotating the substrate.

The present invention is directed to an apparatus for and a method of performing predetermined processing by supplying a processing liquid to a substrate while rotating the substrate. The apparatus comprises: a substrate-supporting unit which supports the substrate; a rotary driving unit which rotates the substrate that is supported by the substrate-supporting unit; a nozzle which supplies the processing liquid to the rotating substrate; a blocking element which is disposed opposing the top surface of the substrate and includes a through hole which is formed on the rim portion of the blocking element so that the nozzle is inserted vertically; and a nozzle move mechanism which moves the nozzle between an opposing position and a retract position, the opposing position being a position at which the nozzle is inserted into the through hole and opposes to the top rim portion of the substrate, the retract position being a position at which is away from the blocking element, wherein the processing liquid is supplied to the top rim portion of the substrate from the nozzle that is positioned to the opposing position. The method comprises of the steps of: disposing a blocking member, which has through holes that vertically pierce the rim portion of the blocking member, opposing to the top surface of the substrate; moving a nozzle from a retract position to an opposing position, the opposing position being a position at which the nozzle is inserted into the through hole and opposes to the top rim portion of the substrate, the retract position being a position which is away from the blocking element; and supplying the processing liquid from the nozzle, which is placed in the opposing position, to the top rim portion of the substrate that is rotating.

In the apparatus and the method, since the blocking member is placed opposing the top surface of the substrate, the top surface of the substrate is completely sealed from the outside atmosphere. The blocking member has a through hole to which the nozzle can be inserted at its rim portion. And the nozzle is inserted to the through hole and disposed facing the top rim portion of the substrate. Therefore, the processing liquid can be supplied directly to the entire top rim portion of the substrate, by feeding the liquid through the nozzle while rotating the substrate. By having the blocking member cover the top surface of the substrate, the adhesion of the processing liquid to the central portion of the top surface of the substrate (non-processed area) is prevented, while keeping the processing width from the edge of the substrate uniform in the radial direction. Moreover, the processing width from the edge of the substrate in the radial direction can be controlled freely by changing the location of the through hole in the blocking member. For example, the processing width can be made greater than the other approach whereby the processing liquid is supplied from the bottom surface and forced to flow over to the top rim portion.

Furthermore, since the nozzle is inserted to the through hole of the blocking member, the splashing of the processing liquid is prevented during the processing process of the substrate, thereby preventing the large amount of processing liquid from adhering to the nozzle, making the nozzle cleaning unnecessary, which result in the increased throughput of the apparatus.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENT

Figure 1:
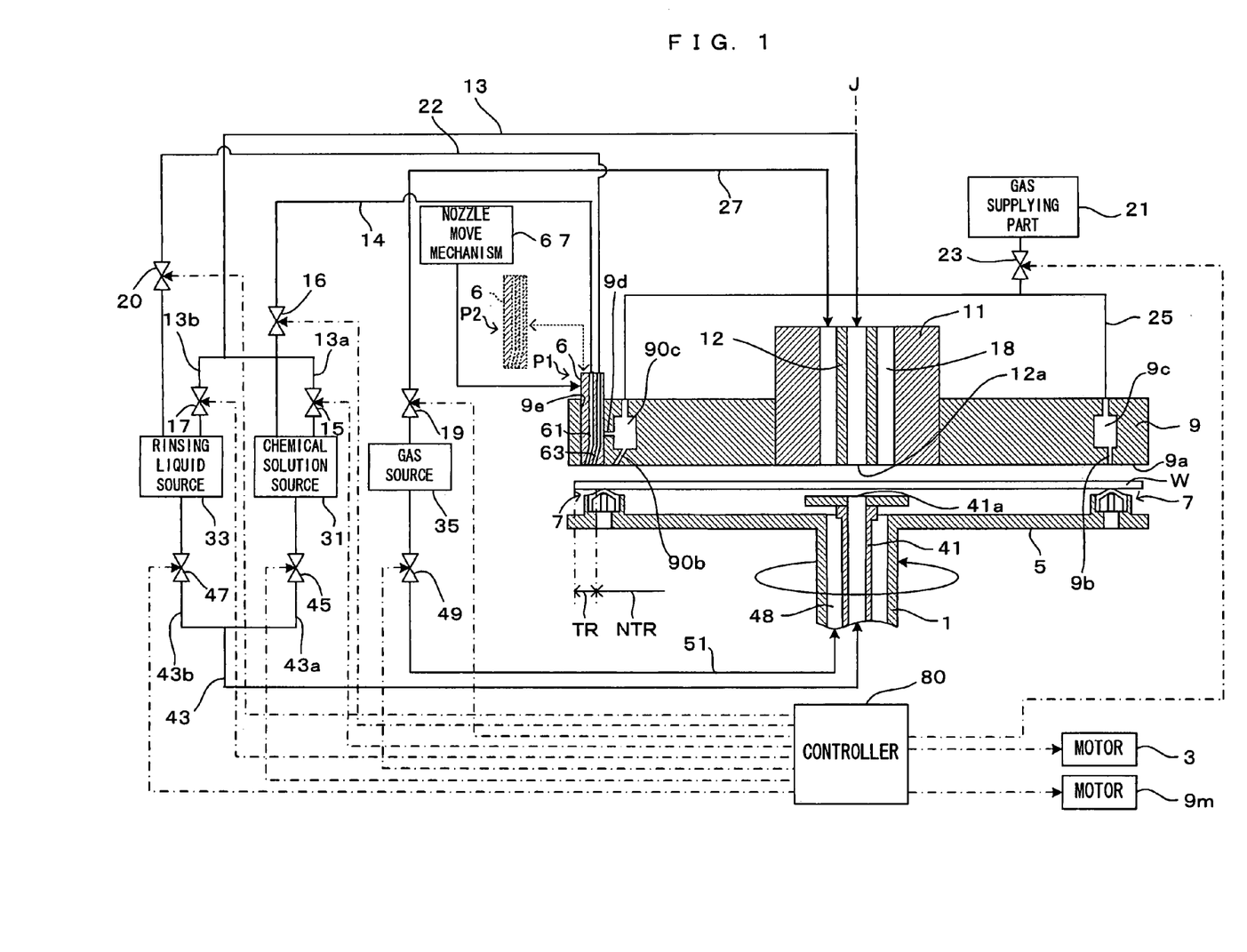
FIG. 1 is a drawing that shows a first embodiment of a substrate processing apparatus according to the present invention.
Figure 2:
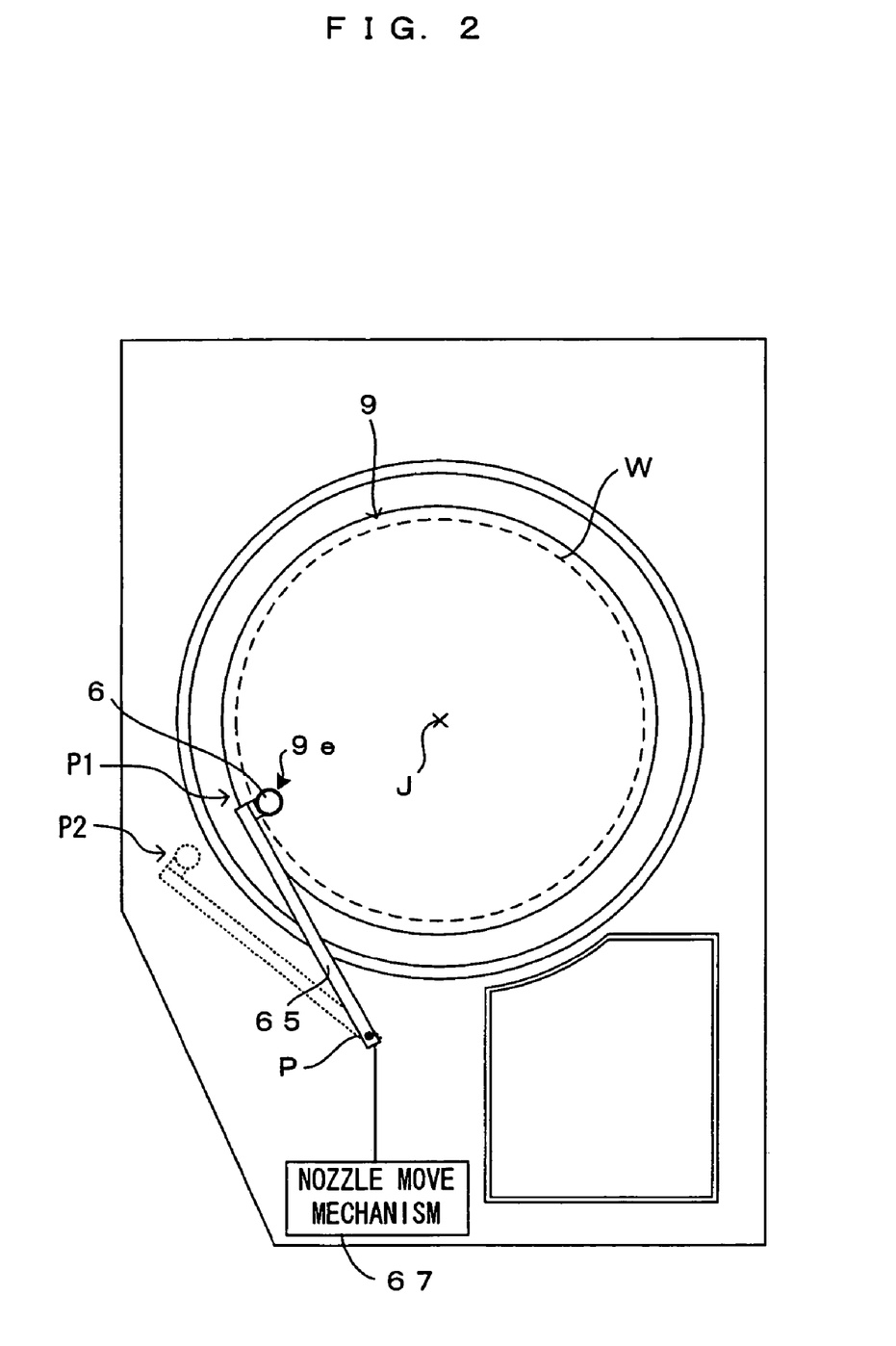
FIG. 2 is a plan view of the substrate processing apparatus that is shown in FIG. 1.

FIG. 1 is a drawing that shows a first embodiment of a substrate processing apparatus according to the present invention. FIG. 2 is a plan view of the substrate processing apparatus that is shown in FIG. 1. In this substrate processing apparatus, a chemical solution of the chemical substance, an organic solvent or the like is supplied to the surface of a substrate W such as a semiconductor wafer, thereby performing chemical processing. After chemical processing, a rinsing liquid such as pure water and DIW is supplied to the surface of the substrate W to rinse. In this specification, the chemical solution and the rinsing liquid are hereinafter also referred to as "processing liquid(s)", as necessary. Spin drying is executed after rinsing of the substrate W. In this substrate processing apparatus, the aforementioned processing can be executed by supplying the processing liquid to the bottom surface of the substrate W. The aforementioned processing can also be executed by supplying the processing liquid to the top surface of the substrate W. In this particular apparatus, it is possible to process the top rim portion of the substrate W (bevel processing) by supplying the processing liquid only to the top rim portion of the substrate W.

In this substrate processing apparatus, a hollow rotation shaft 1 is linked to a rotation shaft of a motor 3, and when driven by the motor 3, the rotation shaft 1 rotates about a vertical axis J. A spin base 5 is linked to and integrated with the top end of the rotation shaft 1 by a fastening component such as a screw. Hence, when driven by the motor 3, the spin base 5 rotates about the vertical axis J. In the vicinity of a rim portion of the spin base 5, there are a plurality of supports 7 which abut on a bottom rim portion of the substrate W and support the substrate W, and these supports 7 are disposed projecting upward from the spin base 5. The substrate W is supported horizontally by the supports 7, with a predetermined distance from the spin base 5. In this embodiment, the spin base 5 thus corresponds to the "rotary member" of the present invention.

Figure 3:
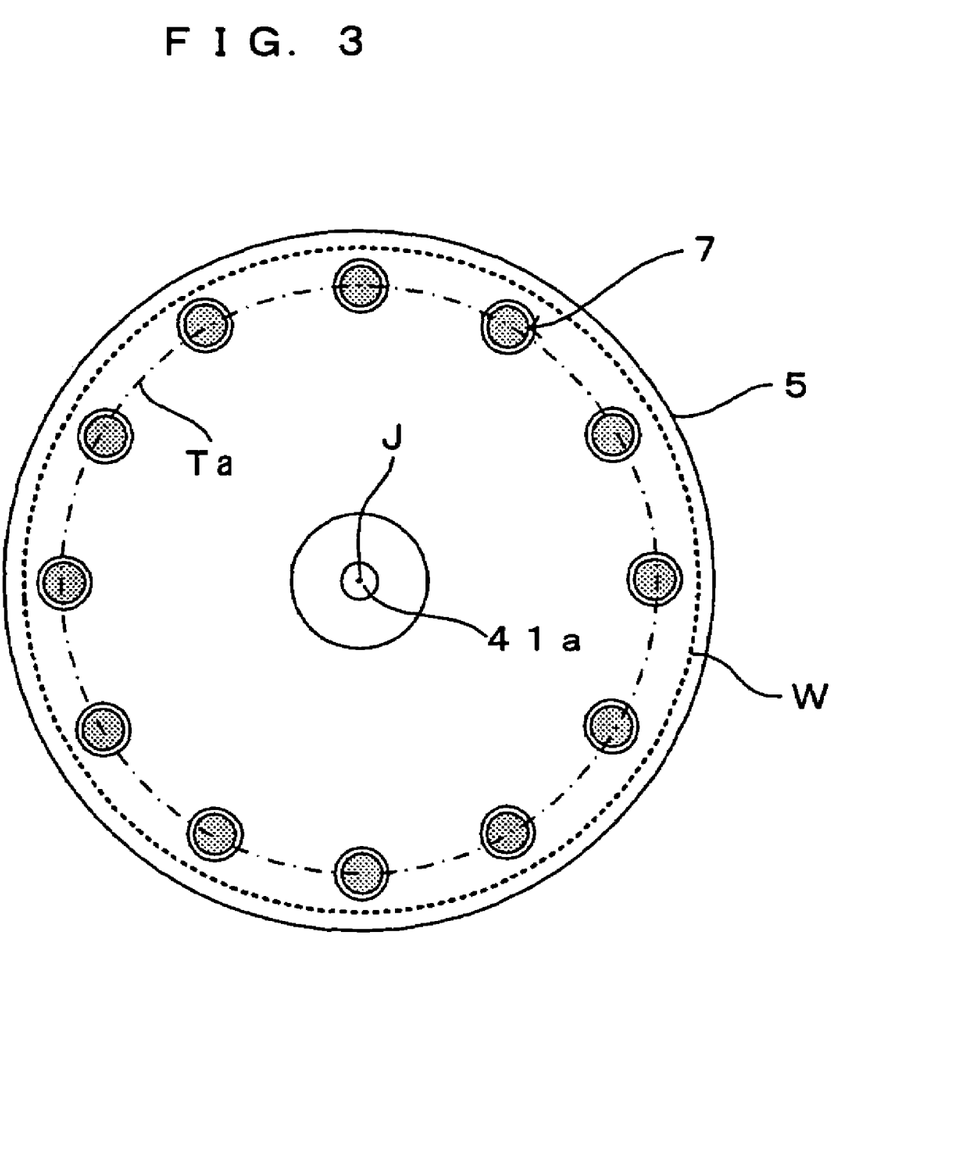
FIG. 3 is a plan view of the spin base as it is viewed from above.

FIG. 3 is a plan view of the spin base 5 as it is viewed from above. There is an opening in a central portion of the spin base 5, and the plurality of supports 7 (twelve supports in this embodiment) are disposed near the rim of the spin base 5. The twelve supports 7 are each apart by 30 degrees about the vertical axis J in a radial arrangement. While at least three supports 7 are needed to support the substrate W horizontally, considering processing of the sections where the supports 7 abut on the bottom surface of the substrate W, it is desirable that the supports 7 are capable of freely abutting on and moving away from the bottom surface of the substrate W and that the supports 7 move away from the bottom surface of the substrate W at least once during processing. Processing of the bottom surface of the substrate W including the sections where the supports 7 abut on the bottom surface of the substrate W necessitates at least four supports 7. If twenty four supports 7, the double the supports 7 used in this embodiment, are disposed, the structure will be more stable without causing any problem. The structure and an operation of the supports 7 will be described in detail later.

The substrate processing apparatus further comprises, as shown in FIG. 1, an atmosphere blocker plate (blocking element) 9 which is disposed opposing the spin base 5 and blocks the atmosphere above the top surface of the substrate W and a gas supplying part 21 which supplies inert gas such as nitrogen gas into the space which is created between the atmosphere blocker plate 9 and the top surface of the substrate W. As the gas supplying part 21 supplies the inert gas into the space toward the top surface of the substrate W, the substrate W is pressed against the supports 7 and the spin base 5 holds the substrate W. Thus, in this embodiment, the spin base 5, the supports 7 and gas supplying part 21 function as the "substrate-supporting unit" of the present invention.

The atmosphere blocker plate 9 is attached to a bottom end of a hollow cylindrical support shaft 11 such that the atmosphere blocker plate 9 can rotate with the support shaft 11 integrally. A block drive mechanism (not shown) which has a motor 9m is linked to the support shaft 11, and therefore, when the motor 9m of the block drive mechanism is driven, the atmosphere blocker plate 9 together with the support shaft 11 rotates about the vertical axis J. Further, by activating an ascend/descend drive actuator (such as an air cylinder) of the block drive mechanism, the atmosphere blocker plate 9 moves closer to or away from the spin base 5. In this embodiment, the motor 3 and the motor 9m corresponds to the "rotary driving unit" of the present invention.

Figure 4:
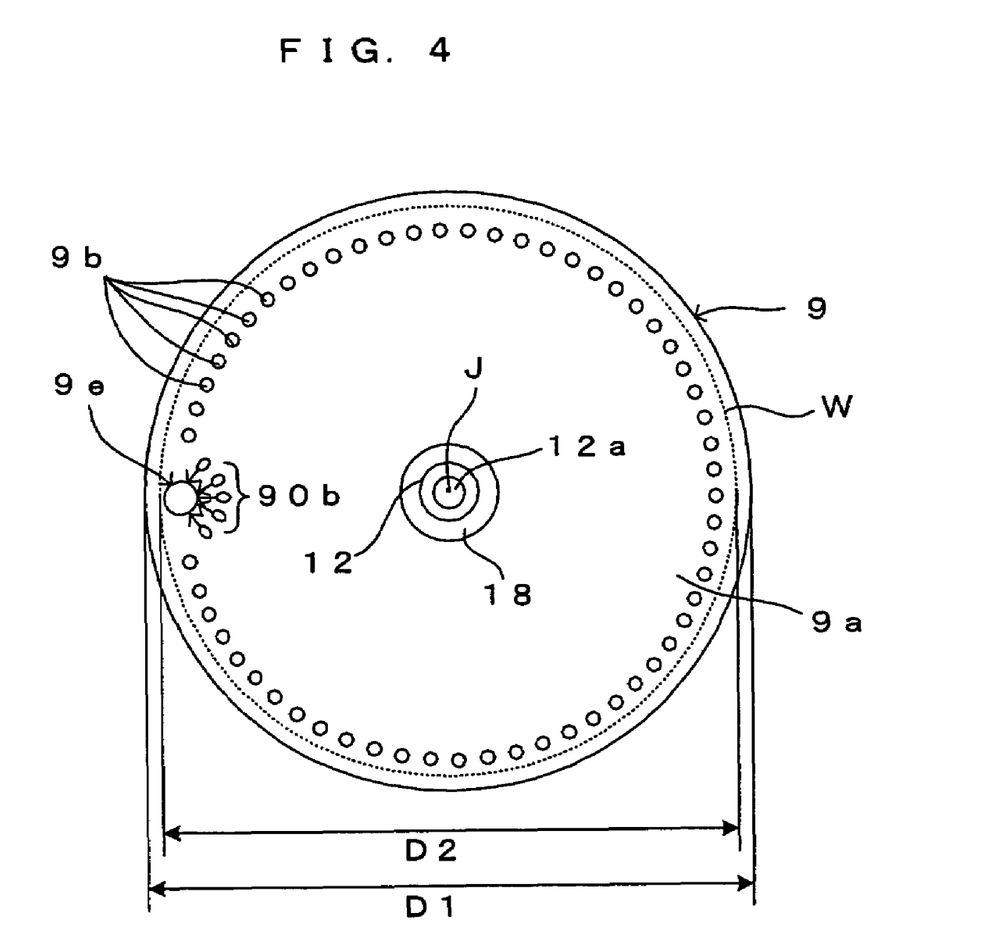
FIG. 4 is a bottom view of the atmosphere blocker plate.

FIG. 4 is a bottom view of the atmosphere blocker plate. The plan size D1 of the surface that opposes to the top surface of the substrate W of the atmosphere blocker 9 is slightly larger than the plan size D2 of the substrate W. The atmosphere blocker 9 has an opening in the center. Also, a single unit of through hole 9e is formed on the rim portion of the blocker plate 9 so as to vertically penetrate the blocker plate 9 (in the direction of vertical ax). This allows for the insertion of the nozzle 6, which will be described later. This through hole 9e is created on the surface that opposes to the top rim portion TR (FIG. 1) of substrate W, which is supported by the spin base 5. Therefore, by inserting the nozzle 6 into the through hole 9e, the nozzle 6 can be placed opposing to the top rim portion TR. The diameter of the opening of the through hole 9e is set to the minimum possible size that allows the insertion of the nozzle 6. This is to prevent such problems as splashing, etc., in association with the through hole 9e, which may occur when the diameter of the opening of the through hole 9e is larger than necessary.

The atmosphere blocker plate 9 is located above spin base 5, and the under surface (bottom surface) of the atmosphere blocker plate 9 is an opposing surface 9a facing the top surface of the substrate W. This opposing surface 9a has a plurality of gas ejection outlets 9b and 90b with openings. These gas ejection outlets 9b are arranged at such positions that correspond to the supports 7 formed on the spin base 5. To be more specific, the plurality of gas ejection outlets 9b are arranged on a rotation path Ta (FIG. 3) of the supports 7 equidistant from each other along the circumference of the disc, which has vertical axis J as its center. Also, the gas ejection outlets 90b are arranged on the central axis (vertical axis J) side with respect to the through hole 9e and around the through hole 9e. These gas ejection outlet 9b and 90b are not necessarily limited to have a plurality of openings, but for example can be made into a single opening by linking each of the plurality of gas ejection outlets 9b (or 90b). Also, it is acceptable to create ring-form opening by linking all of the plurality of gas ejection outlet 9b and 90b in the entire circumference. However, the plurality of openings is more advantageous in attaining a uniform gas ejection pressure. In this embodiment, the atmosphere blocker plate 9, thus, corresponds to the "blocking member" of the present invention, and the gas ejection outlets 9b, 90b, thus corresponds to the "gas ejection outlets" of the present invention.

The description is continued referring back to FIG. 1. These gas ejection outlets 9b and 90b communicate with gas distributing spaces 9c and 90c, respectively. To supply inert gas to the distributing space 9c and 90c, gas distributing spaces 9c and 90c are communicated and connected with gas supplying part 21 through a pipe 25. An on-off valve 23, which is opened and closed under control of a controller 80 that controls the entire apparatus, is placed in the pipe 25. When the controller 80 opens the on-off valve 23, inert gas is supplied from the gas supplying part 21 to gas distributing space 9c and 90c, and is ejected at the plurality of gas ejection outlets 9b and 90b toward the top surface of the substrate W. These gas ejection outlets 9b and 90b are formed on the opposing surface 9a of the atmosphere blocker plate 9 so as to locate on the rotation path Ta of the supports 7. While the gas ejection outlets 9b are arranged to eject inert gas upward to the top surface of the substrate W, the gas ejection outlet 90b is arranged for the downward and outward ejection in the direction of diameter toward the top surface of the substrate W. As the inert gas is ejected uniformly at each of the plurality of gas ejection outlets 9b and 90b, the substrate W is pressed evenly against the respective supports 7 that are disposed projecting upward from the spin base 5. The spin base 5 consequently supports the substrate W horizontally. Since the inert gas is supplied directly to the area in the top surface of the substrate W, which corresponds to the supports 7 which abut on the bottom surface of the substrate W, it is possible to securely hold the substrate W on the spin base 5 in an efficient manner using the minimum necessary amount of gas supply.

The structure and operation of the nozzle 6 will now be described. This nozzle 6 is structured in a cylindrical shape to match the shape of the through hole 9e. When nozzle 6 is inserted to the through hole 9e, the tip of the nozzle 6 faces the rim portion TR of the top surface of the substrate W. Also, the nozzle 6 is inserted all the way to where the bottom edge of the tip of the nozzle 6 is flush with the opposing surface 9a of the atmosphere blocker plate, thereby permitting the supply of processing liquid to the top rim portion TR of the substrate W through the nozzle 6. The nozzle 6 is equipped with a chemical solution pipe 61 and a rinsing liquid pipe 63, so that chemical solution and DIW for a rinsing liquid are supplied to the top rim portion of the substrate W from the top end (bottom end) of supplying pipes 61 and 63, respectively. While the chemical solution pipe 61 is connected with a chemical solution source 31 via a pipe 14, the rinsing liquid pipe 63 is connected with a DIW source 33 via a pipe 22. On-off valves 16 and 20 are placed respectively in the pipes 14 and 22, and therefore, as the controller 80 controls on-off valves 16 and 20, the flow rates of the chemical solution and DIW fed to the nozzle 6 are adjusted.

The nozzle 6 is fixed to the top end of one arm 65 (FIG. 2). On the other hand, a nozzle move mechanism 67 is linked with the base end of the arm 65. The nozzle move mechanism 67 is activated in response to a control command from the controller 80, to get the arm 65 move in ascending/descending motion and pivots about the core of rotation P. Therefore, when the nozzle 6 is inserted in the through hole 9e of the atmosphere blocker plate 9, it becomes capable of moving between an opposing position P1 and a retract position P2. The position P1 is detonated at the solid line in FIG. 1 and FIG. 2 and is opposed against the substrate W and at which the processing liquid is supplied to the top rim portion TR of the substrate W. The position P2 is up and off to the side from the opposing position P1.

A gas introduction inlet 9d is disposed in the inner wall of the through hole 9e of the atmosphere blocking plate 9, and the gas introduction inlet 9d is connected with the gas distribution space 90c. Therefore, when the inert gas is supplied from the gas supplying part 21, the inert gas is ejected at the gas ejection outlets 9b and 90b to the top surface of the substrate W while the inert gas is also introduced into the through hole 9e. Therefore, when the nozzle 6 is positioned to the retract position P2, i.e., when the nozzle 6 is not inserted in the through hole 9e, the inert gas is introduced from the gas supplying part 21 to the though hole 9e, thereby allowing the inert gas to be ejected from the openings of the through hole 9e above and below the atmospheric blocker plate 9. Thus, in this embodiment, the gas distributing space 9c, gas introduction inlet 9d and the gas supplying part 21 corresponds to the "gas ejection unit" of the present invention.

An upper clean nozzle 12 is disposed coaxially to the opening at the center of the atmosphere blocker plate 9 and to the hollow section of the support shaft 11 so that at a nozzle outlet 12a at the bottom end of the upper clean nozzle 12, the processing liquid such as a chemical solution and a rinsing liquid can be supplied to an area which is near the rotation center of the top surface of the substrate W which is pressed against and held at the spin base 5. The upper clean nozzle 12 is connected to a pipe 13. The pipe 13 branches off at the base end. One branch pipe 13a is connected to a chemical solution source 31, while the other branch pipe 13b is connected to a rinsing liquid source 33. On-off valves 15 and 17 are placed respectively in the branch pipes 13a and 13b, making it possible to switch between supply of a chemical solution and supply of a rinsing liquid and thus selectively supply the chemical solution or the rinsing liquid to the top surface of the substrate W from the upper clean nozzle 12 as the on-off valves 15 and 17 open and close under control of the controller 80.

The gap between the inner wall surface of the hollow section of the support shaft 11 and the outer wall surface of the upper clean nozzle 12 serves as a gas supply path 18. The gas supply path 18 is communicated with a gas source 35 via a pipe 27 in which an on-off valve 19 is placed. After chemical processing or rinsing using the upper clean nozzle 12, as the on-off valve 19 opens and closes under control of the controller 80, gas such as clean air and inert gas is supplied via the gas supply path 18 into the space which is created between the top surface of the substrate W and the opposing surface 9a of the atmosphere blocker plate 9, and the substrate W is accordingly dried.

A lower clean nozzle 41 is disposed coaxially to the hollow section of the rotation shaft 1, to thereby supply at a nozzle outlet 41a, which is at the top end of the lower clean nozzle 41, the processing liquid to an area which is near the rotation center of the bottom surface of the substrate W. The lower clean nozzle 41 is connected to a pipe 43. The pipe 43 branches off at the base end. One branch pipe 43a is connected to the chemical solution source 31, while the other branch pipe 43b is connected to the rinsing liquid source 33. On-off valves 45 and 47 are placed respectively in the branch pipes 43a and 43b, making it possible to switch between supply of the chemical solution and supply of the rinsing liquid and thus selectively to supply the chemical solution or the rinsing liquid to the bottom surface of the substrate W from the lower clean nozzle 41 as the on-off valves 45 and 47 open and close under control of the controller 80.

The gap between the inner wall surface of the rotation shaft 1 and the outer wall surface of the lower clean nozzle 41 serves as a gas supply path 48. The gas supply path 48 is communicated with the gas source 35 via a pipe 51 in which an on-off valve 49 is placed, and therefore, it is possible to supply gas such as clean air and inert gas via the gas supply path 48 into the space between the bottom surface of the substrate W and the opposing surface of the spin base 5 as the on-off valve 49 opens and closes under control of the controller 80.

Figure 5:
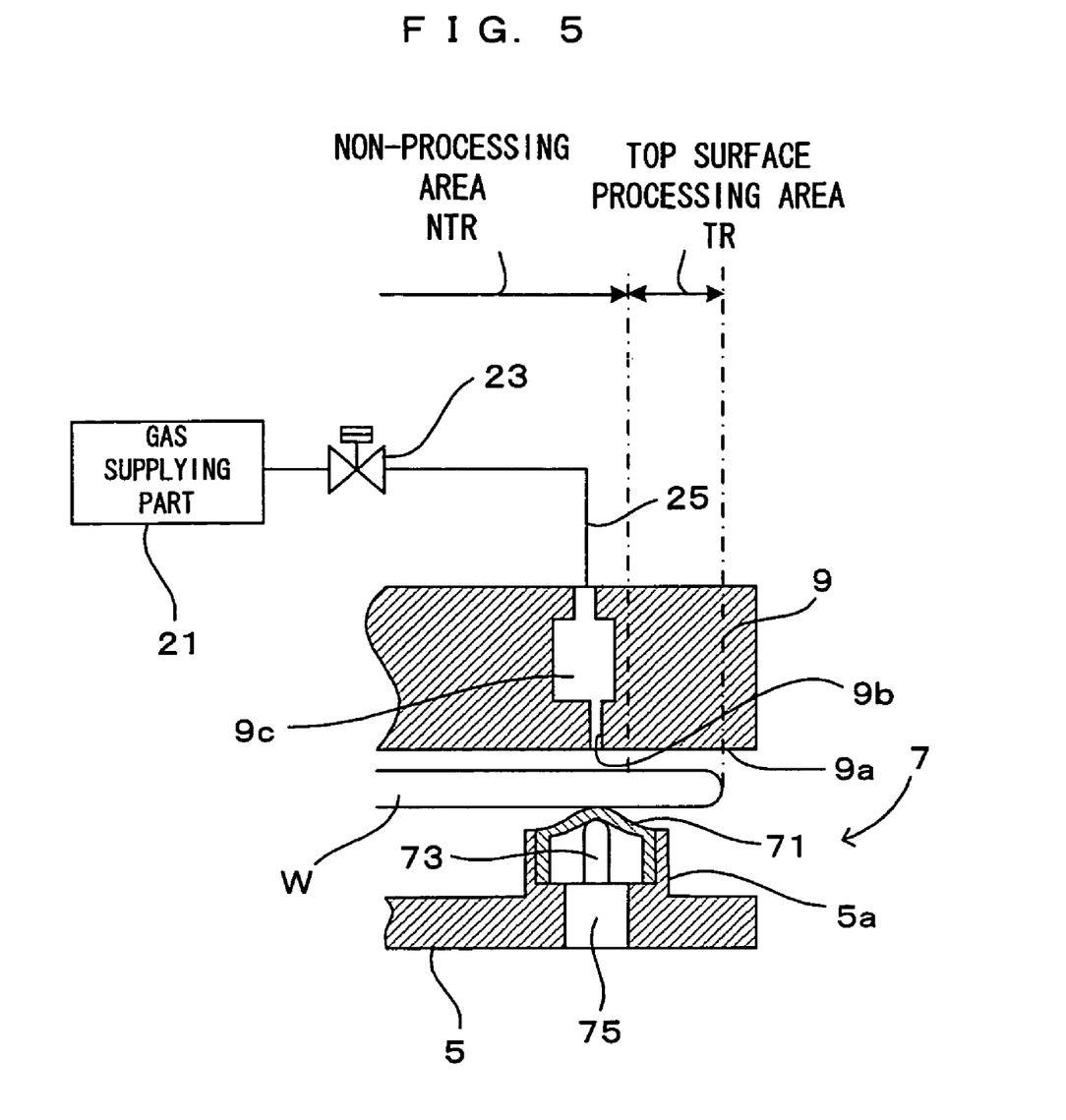
FIG. 5 is a partial cross sectional view showing the structure of the supports.

The structure and an operation of the supports 7 will now be described. FIG. 5 is a partial cross sectional view showing the structure of the supports. Since all the supports 7 have the identical structures, the structure of only one support 7 will be described with reference to FIG. 5. As shown in FIG. 5, a rim portion of a top surface of the spin base 5 is protruded upward to form a protrusion 5a which has a form of a hollow circular cylinder opening upward. The support 7 is disposed inside the protrusion 5a and comprises a film member 71, a movable rod 73, and a driver 75. The film member 71 has a form of a hollow circular cylinder opening downward and is made of a flexible material. The film member 71 is disposed inside the protrusion 5a in such a manner that the outer circumference of the film member 71 is in close contact with the inner circumference of the protrusion 5a. The movable rod 73 is disposed inside the film member 71 and is supported to freely move up and down to abut on and move away from the bottom surface of the top center of the film member 71. The driver 75 such as a motor is linked to the movable rod 73 via a drive link section not shown and moves the movable rod 73 upward and downward. The driver 75 is not limited to a motor. Actuators in general such as air cylinders may be used instead.

In the support 7 having the above structure, as the driver 75, when receiving a drive signal from the controller 80, drives the movable rod 73 upward via the drive link portion, the top end of the movable rod 73 abuts on the bottom surface of the top center of the film member 71 and pushes up the top center of the film member 71. As this occurs, the top surface of the film member 71 projects beyond the top end of the protrusion 5a of the spin base 5. Hence, with all (or at least three) of the film members 71 of the plurality of supports 7 projected in this fashion, the substrate W is supported horizontally with a distance (which may be about 1 mm) from the top end of the protrusions 5a of the spin base 5 while maintaining the contact between the film members 71 and the bottom surface of the substrate W (FIG. 5). On the contrary, when the driver 75 drives the movable rod 73 downward, the top end of the movable rod 73 moves away from the bottom surface of the top center of the film member 71, and the top surface of the film member 71 retracts back to the same plane as the top end of the protrusion 5a of the spin base 5 on its own because of its flexibility. Thus, among the projecting film members 71 of the plurality of supports 7, when some except for at least three are moved down, the descended film members 71 move away from the bottom surface of the substrate W. In addition, such film members 71 are made of resin which is flexible and anti-corrosive against the processing liquid. A fluororesin such as PCTFE (polychlorotrifluoroethylene) is preferably used as the film members 71. In this embodiment, the film members 71 thus correspond to the "supporting members" of the present invention.

In the above apparatus, the processing liquid is supplied from the nozzle 6 to the top rim portion of the substrate W to provide bevel processing to the top processing area TR. A description will now be given on the relationships between the top processing area TR and a supplying position of the inert gas which is ejected from gas ejection outlets 9b and 90b that are formed in the opposing surface 9a of the atmosphere blocking plate 9, and between the top processing area TR and the location of the support 7. While FIG. 5 illustrates the supports 7 and the supplying position of the inert gas which is ejected from the gas ejection outlet 9b, the relationship of the location gas ejection outlet 90b with the location of the supplying position of the inert gas and the location of supports 7 is basically similar to the relationship that is described in FIG. 5. There are two gas flows: one being the flow of the inert gas that is ejected from the gas ejection outlet 9b in vertically upward direction toward the top surface of the substrate W; and the other being the flow of the inert gas that is ejected from the gas ejection outlet 90b downward and outward in radial direction toward the top surface of the substrate W. The inert gases are supplied to a non-processing area NTR that is on the inner side relative to the top processing area TR, which is processed with the processing liquid that is supplied form the nozzle 6. On the other hand, the supports 7 are disposed in the rim portion of the spin base 5 so as to abut on and support the section in the bottom surface of the substrate W corresponding to the non-processing area NTR, to which the inert gas is supplied. This structure prevents the entry of the processing liquid to the non-processing area NTR and ensures the uniform processing width from the edge surface along the radial direction of the substrate W, while keeping the substrate W pressed against and held by the spin base 5. Particularly, at the gas ejection outlets 90*b*, which are around through hole 9*e* to which the nozzle 6 is inserted, since the inert gas is ejected downward and outward in the radial direction toward the top surface of the substrate W. As this inert gas ejection occurs, the entry of the processing liquid that is fed form the nozzle 6 to the non-processing area NTR is completely prevented.

Figure 6:
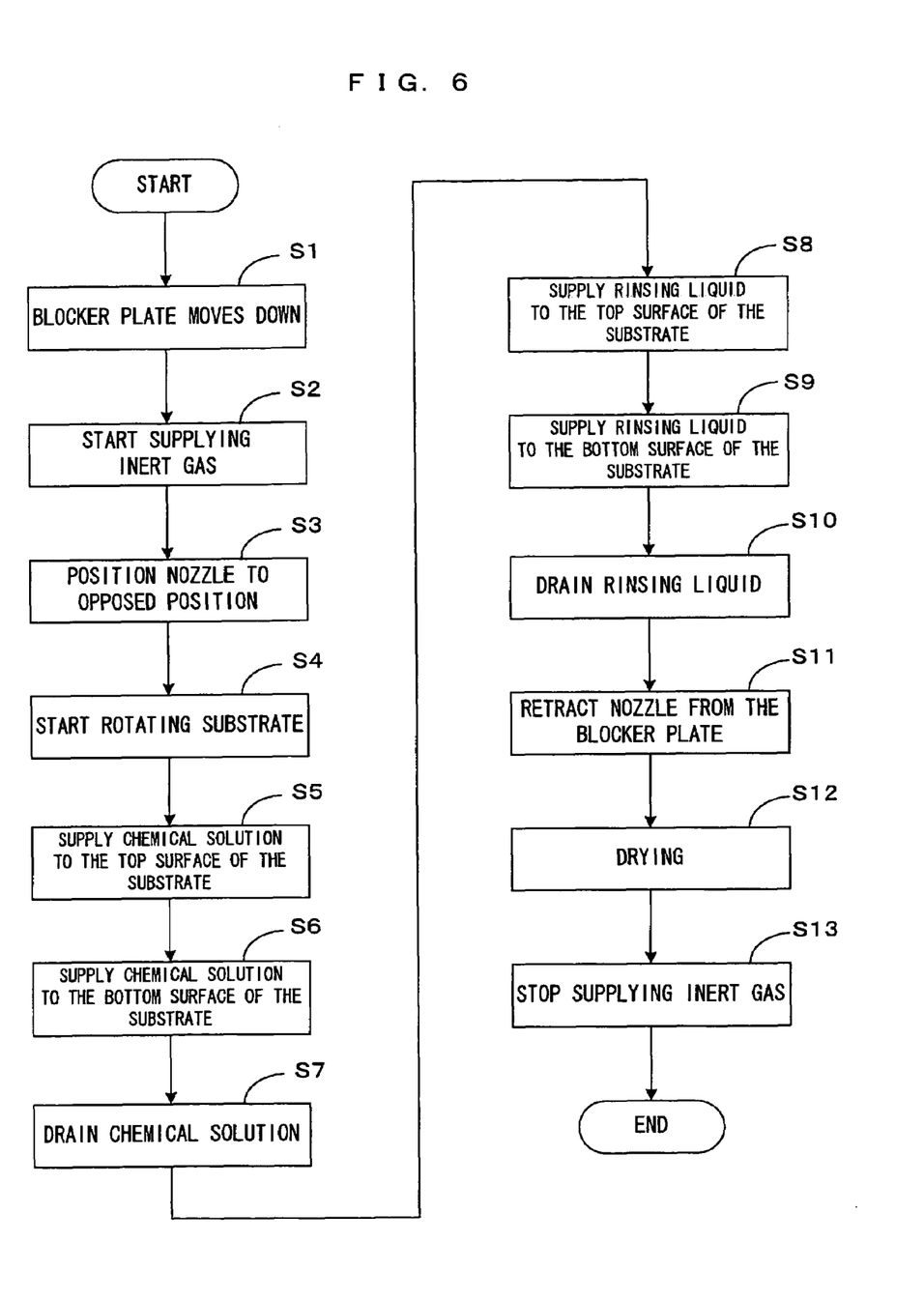
FIG. 6 is a flow chart that describes the operation of the substrate processing apparatus shown in FIG. 1.

An operation of the substrate processing apparatus having the structure above will now be described in reference to FIG. 6. FIG. 6 is a flow chart that describes the operation of the substrate processing apparatus shown in FIG. 1. To be more specific, processing of the bottom surface of the substrate W, with the processing liquid supplied to the bottom surface of the substrate W will now be described, as well as the processing of the top rim portion TR of the substrate W with the processing liquid supplied to the top surface of the substrate W. In this substrate processing apparatus, a substrate transportation robot not shown transports an unprocessed substrate W to the substrate processing apparatus. As the substrate W is mounted on the supports 7 at its back surface on the support 7 with the device seating surface of the substrate W facing up, chemical processing, rinsing and drying are executed while the controller 80 controls the respective portions of the apparatus in the manner below. While the substrate transportation robot transports the substrate W, the atmosphere blocker plate 9, the support shaft 11 and upper clean nozzle 12 retract as one unit above the spin base 5 and stay away from the spin base 5.

Once the substrate W is mounted on the supports 7 in this manner, the atmosphere blocker plate 9, the support shaft 11 and upper clean nozzle 12 move down as one unit and the atmosphere blocker plate 9 is located close to the substrate W (step S1). Consequently, the top surface (device seating surface) of the substrate W will be covered by the opposing surface 9*a* of the atmosphere blocker plate 9 which has come very close to the top surface of the substrate W. With the on-off valve 23 open, the inert gas from the gas supplying part 21 is ejected at the plurality of gas ejection outlets 9*b* and 90*b*, which are formed in the opposing surface 9*a* of the atmosphere blocker plate 9. Consequently, the substrate W is pressed against the supports 7 and is held by the spin base 5 (step S2). In this state, as the inert gas is ejected evenly at the plurality of gas ejection outlets 9*b* and 90*b*, the substrate W is pressed evenly against each of the supports 7 and held horizontally.

Figure 7A:
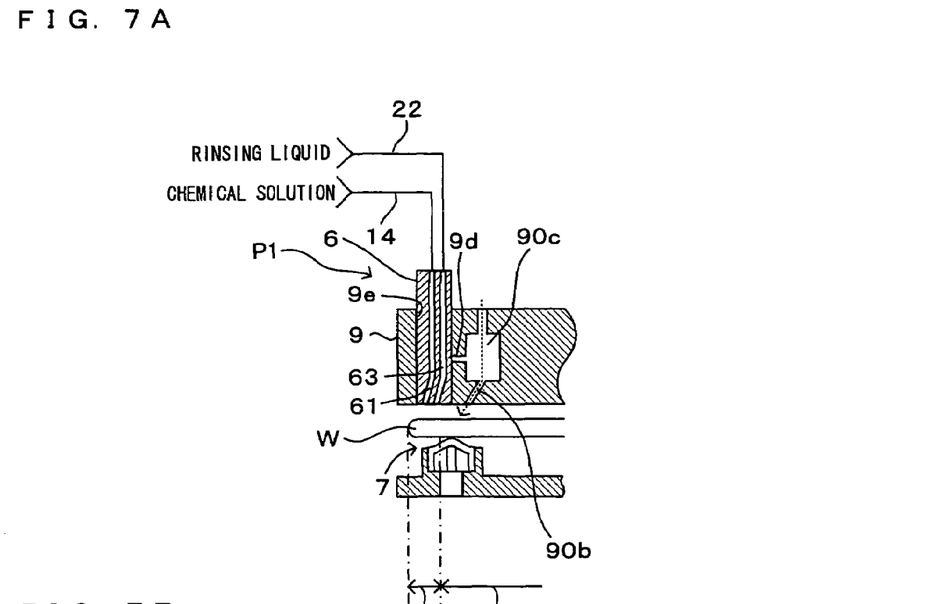
FIGS. 7A and 7B are drawings that show the operation of the apparatus of FIG. 1.

The controller 80 activates the nozzle move mechanism 67 so that the nozzle 6 is inserted to the through hole 9*e* in the atmosphere blocker plate 9 and is positioned to the opposing section P1 (step S3) as described in FIG. 7A. Following this, controller 80 activates motor 3 to rotate substrate W in one unit with the spin base 5, while keeping the atmosphere blocker plate 9 come into a standstill (step S4). The substrate W, which is pressed against the support 7, rotates together with spin base 5 as it is supported by the supports 7 due to the friction force between supports 7 and substrate W. Following this, with the on-off valve 16 open, the chemical solution is supplied from the nozzle 6, to the top rim portion TR (step S5). With this, the chemical solution is supplied evenly to the entire circumference of the top rim portion TR of the substrate W in the pre-determined width, thereby achieving the chemical processing of the top rim portion TR of the substrate W.

After the chemical solution is supplied to the top rim portion TR of the substrate W, controller 80 opens the on-off valve 45. This allows the chemical solution from the chemical solution supply source 31 supplied at the nozzle outlet 41*a* of the lower clean nozzle 41 to the central portion of the bottom surface of the substrate W (step S6). The chemical solution which is supplied to the central portion of the bottom surface of the substrate W spreads throughout the bottom surface due to the centrifugal force created by the rotation of the substrate W, thereby achieving the chemical processing of the entire bottom surface of the substrate W. As the respective supports 7 moves away at least once from the bottom surface of the substrate W during the chemical processing, the chemical solution flows even into those sections where the support 7 and the substrate W contacts and these contact sections are processed. To this end, the twelve supports 7 may move away one at a time for example, or to the extent that at least three supports 7 remain abutting on the bottom surface of the substrate W, two or more supports 7 may move away at a time. Further, the inert gas may be supplied from the gas supply path 18 to keep the substrate W pressed against support 7 and to oppose against the pressure of ejection of the chemical solution at the nozzle outlet 41*a* of the lower clean nozzle 41 in the central portion of the bottom surface of the substrate W. Further, the chemical processing of the top surface of the substrate W may be executed during the chemical processing of the top rim portion TR of the substrate W, or in a manner that partially overlaps with the timing of chemical processing of the top rim portion of the substrate W. After the chemical processing for a predetermined period of time, while the rotation of the substrate w is kept, controller 80 will close on-off-valves 16 and 45 to stop the supply of the chemical solution from the chemical solution supplying source 31. Hence, the chemical solution is drained and released to the outside of the substrate.

Since the nozzle 6 is inserted in the through hole 9*e* of the atmosphere blocker plate 9, even in the situation where the chemical solution splashes and bounce back at the nozzle 6, the chemical solution is blocked by the opposing surface 9*a* of the atmosphere blocker plate 9, thereby preventing the adherence of chemical solution around the nozzle 6 (the sides wall). This prevents potential damage caused by the dripping of the chemical solution from the nozzle 6 and adherence to the substrate W and the surrounding members of the substrate. Therefore, the cleaning of the nozzle 6 becomes unnecessary, which results in the improvement of the apparatus throughput.

The chemical solution that is supplied to the top rim portion TR and bottom surface of the substrate W splashes outward in the radial direction of the substrate W. In this embodiment, however, the absence of supporting members such as chuck pins which supports the outer edge of the substrate W, prevents the chemical solution that moves outwardly in the radial direction of the substrate W from bouncing back at the surface of the substrate W. Further, the absence of the factor which disturbs the airflow near the outer edge of the substrate W reduces the sucking in of the mist-like processing liquid toward the surface of the substrate. Therefore, splashing back of the chemical solution at non-processed area NTR on the top surface of the substrate W is prevented, thereby preventing the corrosion of the device-seating surface. Furthermore, prevention of the sucking in of the mist-like processing liquid will inhibit the adhesion of the particles to the surface of the substrate.

Once draining of the chemical solution is completed in this manner (step S7), the controller 80 opens the on-off valve 20 to supply the rinsing liquid (pure water, DIW and the like), from the nozzle 6 to the top rim portion TR of the substrate W (step S8). In this state, rinsing is performed to rinse away the chemical solution adhering to the top rim portion TR of the substrate W with the rinsing liquid. Further, controller 80 opens the on-off valve 47 to perform rinsing of the bottom surface of the substrate W at the following timing: after the rinsing process of the top rim portion TR of the substrate W is completed; during the rinsing process of the top rim portion TR of the substrate W; or at the timing which partially overlap with the rinsing process of the top rim portion TR of the substrate W (step S9). After rinsing for a pre-determined period of time, the controller 80 closes the on-off valve 20, 47 to stop the supply of rinsing liquid and rinsing liquid is drained off and released to the outside of the substrate (step S10).

Following this, the controller 80 activates the nozzle move mechanism 67 to pull the nozzle 6 out of the through hole 9e and position the nozzle 6 to the retract position P2 which is away from the atmosphere blocker plate 9 (step S11). Next the controller 80 activates the motor 3. The motor 3 moves at a high speed to accelerate the rotation speed of the substrate W to perform drying of the substrate W (step S12). The liquid components adhering to the surface of the substrate are drained off owning to the centrifugal force. As activating the motor 9m of the blocker drive mechanism not shown, the atmosphere blocker plate 9 rotates about the vertical axis J together with the support shaft 11, thereby spin-drying is executed effectively. In addition, rotating atmosphere blocker plate 9 together with substrate W will prevent the rotation from creating unnecessary airflow between the substrate W and the atmosphere blocker plate 9. During this drying process, the controller 80 opens the on-off valve 49 to introduce inert gas into the space between the bottom surface of the substrate W and the opposing surface of the spin base 5 at the pre-determined flow rate from the gas supplying source 35 as well as opening the on-off valve 19 to introduce inert gas into the space between the top surface of the substrate W and the opposing surface 9a of the atmosphere blocker plate 9 at the predetermined flow rate. As a result, the space that surround the substrate W is rapidly replaced with the inert gas, which prevents contamination of the substrate W with the chemical atmosphere that remains in the space. Furthermore, unwanted oxide film will not grow on the top and the bottom surface of the substrate W.

Figure 7B:
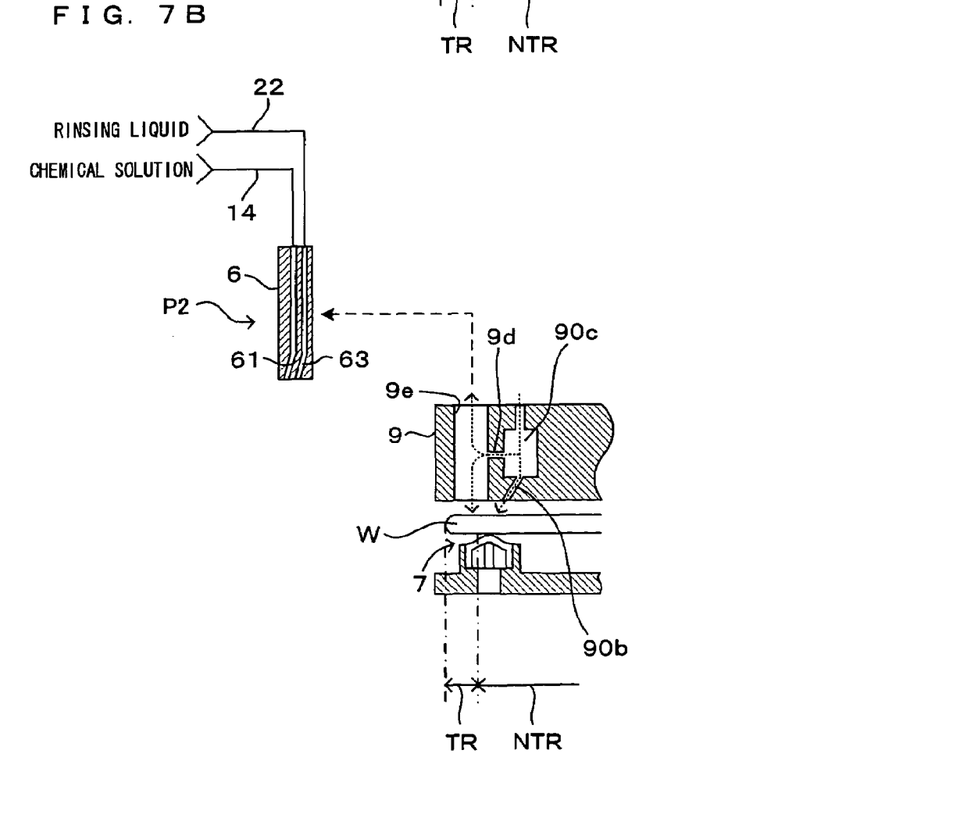

When the nozzle 6 is positioned in the retract position P2 and pulled out from the through hole 9e, the inert gas that is introduced from the gas introduction inlet 9d to the through hole 9e is ejected strongly at the through hole 9e above and below the atmosphere blocker plate 9 (FIG. 7B). This prevents the rinsing liquid from entering the through hole 9e, thereby preventing the rinsing liquid from splashing back at the substrate W even when the nozzle 6 is pulled out of the through hole 9e. Therefore, splashing back of the rinsing liquid from the through hole 9e is prevented, thus corrosion will not develop in the device seating area in the central portion of the top surface of the substrate W (unprocessed area).

After the drying is completed, the controller 80 stops the motor 3, thereby stopping the rotation of the substrate W, and stops the motor 9m of the block drive mechanism, thereby stopping the rotation of the atmosphere blocker plate 9. The on-off valve 23 is thereafter closed and the supply of the gas from gas supply path 21 is stopped, thereby releasing the substrate W from being pressed against and held. The atmosphere blocker plate 9 then is moved up, and the substrate transportation robot unloads the processed substrate W. This completes an operation sequence of chemical and rinsing processes.

As described above, in this embodiment, the plan size D1 of the atmosphere blocker plate 9 is at least equal to or larger than the size of the substrate, therefore, placing the atmosphere blocker plate 9 above and opposing to the substrate W, will ensure the blocking of the top surface of the substrate W from the outside atmosphere around the substrate W. Also, the presence of through hole 9e, into which the nozzle 6 can be inserted, in the rim portion of the atmosphere blocker plate 9, enables the nozzle 6 to be inserted to the through hole 9e and be placed in the position opposing to the top rim portion TR of the substrate W. Therefore, the processing liquid can be supplied directly to the entire circumference of the top rim portion TR of the substrate W, when the processing liquid is supplied from the nozzle 6 while substrate W that is supported by the spin base 5 is rotated. Covering the entire top surface of the substrate W with the atmosphere blocker plate 9 ensures that the substrate W is processed in even processing width in the radial direction from the edge surface of the substrate W, while adherence of the processing liquid to the central portion of the top surface of the substrate W is prevented.

This embodiment has following advantages, compared with the approach in which the processing liquid is supplied to the bottom surface of the substrate W and is circled over via the edge surface of the substrate W for the processing of the top rim portion TR of the substrate W. To be more specific, in this embodiment, it is easier to control the processing width from the edge surface along the radial direction of the substrate W, hence precise control of the processing width and increase of the processing width are also possible. Even when the substrate W such as a semi conductor wafer has a notch, it is possible to ensure the uniformity of the processing width in the notch.

Also in this embodiment, positioning of the nozzle 6 in the retract position P2 which is away from the atmosphere blocker plate 9 makes it possible to rotate atmosphere blocker plate 9 together with the substrate W. This prevents the rotation from developing unnecessary air flow in the space between substrate W and atmosphere blocker plate 9, while the processing liquid adhering to the atmosphere blocker plate 9 is drained off completely, thereby facilitating for better substrate processing.

Also, in this embodiment, since the nozzle 6 is in the through hole 9e, even if the processing liquid splashes back toward the processing liquid nozzle 6 during the processing of the substrate, the opposing surface 9a of the atmosphere blocker plate 9 blocks the processing liquid, therefore preventing the large amount of processing liquid from adhering to the nozzle 6. Hence, the processing liquid will not drip from the nozzle 6 to adhere to the substrate W or to the portions around the substrate W as the nozzle moves, preventing the processing liquid from causing adverse influence. The nozzle 6 therefore does not have to be cleaned, which improves the apparatus throughput.

Further, since the inert gas is ejected through both the top and the bottom openings of the through hole 9a, even when the nozzle 6 is positioned to the retract position P2, that is away from the atmosphere blocker plate 9 in this embodiment, the processing liquid will not enter the through hole 9e nor splash back at the substrate W. Therefore, the splashing of processing liquid originating from the through hole 9e is prevented, thus preventing the corrosion of the device-seating surface in the central portion of the top surface (the non-processing area NTR) of the substrate W.

Furthermore, since the inert gas is ejected at the through hole 9e when the nozzle 6 is pulled out from the through hole 9e in this embodiment, inert gas will be supplied efficiently. In addition, since the inert gas from the gas distribution space 9c is introduced into the through hole 9e via the gas introduction outlet 9d, the gas supplying part 21 and pipe 25, which press and hold the substrate W against the spin base 5, can be used for multiple processes, contributing to the simplification of the structure of the apparatus.

Further, in this embodiment, the substrate W is supported by the supports 7 that abut on the bottom surface of the substrate W in such a manner that the substrate W can move away from the supports 7, and as the inert gas is supplied to the top surface of the substrate W, substrate W is pressed against the supports 7 and held by the spin base 5. Then the substrate W is held by the supports 7 due to the development of the friction between the substrate W and supports 7, to rotate together with the spin base 5. Since the substrate W is held this way, the supporting members such as chuck pins, etc., which contacts the substrate W at the outer edge of the substrate W, will not be needed. Thus, while the substrate W rotates, the processing liquid that moves outwardly along the radial direction on the surface of the substrate will not hit the supporting members such as chuck pins, therefore splashing back at the surface of the substrate is prevented. Further the absence of a factor that disturbs airflow near the outer edge of the substrate reduces blowing of the mist of the processing liquid toward the surface of the substrate. This effectively prevents the processing liquid from adhering to the central portion of the top surface of the substrate.

Figure 8:
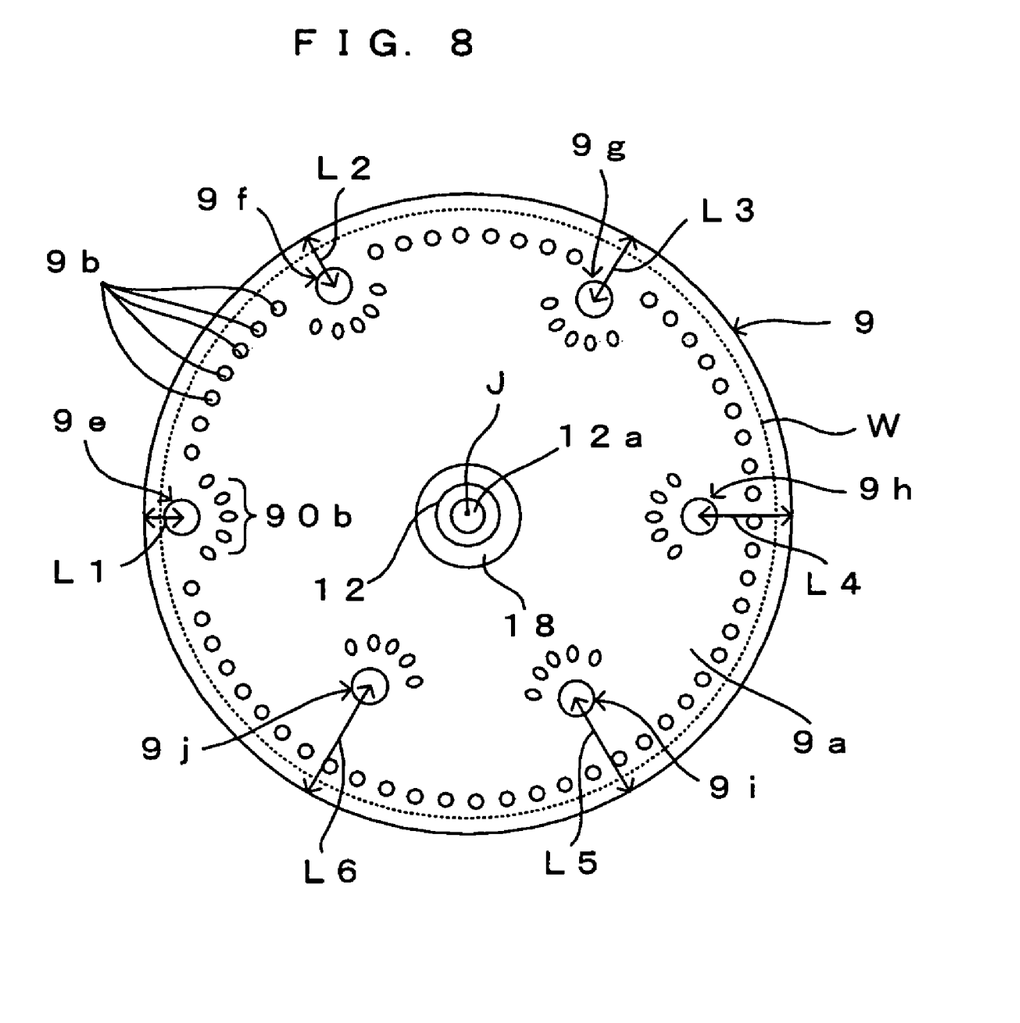
FIG. 8 shows the bottom view of the atmosphere blocker plate with plurality of through holes.

This invention is not limited to the embodiments described above but may be modified in various manners in addition to the embodiments above, to the extent not deviating from the object of the invention. For instance, although a though hole 9e is formed at a single location on the rim portion of the atmosphere blocker plate 9 in the embodiment described above, this is not limiting. For example, a plurality of through holes can be formed at multiple locations on the rim portion of the atmosphere blocker plate 9, as described in FIG. 8. FIG. 8 shows the bottom view of the atmosphere blocker plate with plurality of through holes 9e-9j formed in 6 locations. In this case, by varying the distance L1-L6 from the through hole 9e-9j to the surface of the edge of the atmosphere blocker plate 9 so that an inequality (L1<L2<L3<L4<L5<L6) is satisfied, the processing width from the surface of the edge of the substrate W along the radial direction can be changed. By selectively inserting the nozzle 6 into any of the through holes 9e-9j, the processing width from the edge surface of the substrate W along the radial direction can be changed in accordance with the specifications of the processing while ensuring a uniform processing width. Further, by ejecting inert gas at the through hole 9e-9j, prevents splashing back of the processing liquid due to the presence of through hole 9e-9j.

In addition, in the embodiment described above, the nozzle 6 and the through hole 9e are cylindrical in shape, but this is not limiting. For example, the top portion of the nozzle can be tapered (truncated cone shape), and the through hole can be shaped to match the shape of the nozzle.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus for performing predetermined processing by supplying a processing liquid to a substrate while rotating the substrate, the apparatus comprising:
   a substrate-supporting unit which holds the substrate;
   a rotary driving unit which rotates the substrate held by the substrate-supporting unit;
   a nozzle which supplies the processing liquid to a top rim portion of the rotating substrate;
   a blocking member which is disposed opposing a top surface of the substrate and includes a through hole which vertically penetrates a rim portion of the blocking member and which includes a shape allowing the nozzle to be inserted into the through hole, the rim portion being positioned inwardly from a surface of an edge of the blocking member;
   a nozzle move mechanism which moves the nozzle between an opposing position and a retract position, the opposing position being a position at which the nozzle opposes the top rim portion of the substrate by being inserted into the through hole, the retract position being a position which is distanced from the blocking member;
   a gas ejection unit which ejects gas from the through hole when the nozzle is positioned to the retract position; and
   a controller which is configured to cause the nozzle to supply the processing liquid to the top rim portion of the substrate when the nozzle is positioned to the opposing position.

2. The substrate processing apparatus of the claim 1, wherein the rotary driving unit rotates the blocking member together with the substrate when the nozzle is positioned to the retract position.

3. The substrate processing apparatus of claim 1, wherein the blocking member has a plurality of the through holes, with each of them at varying distances along the radial direction from the outer edge of the blocking member.

4. The substrate processing apparatus of claim 1, wherein the blocking member has a surface, opposing to the top surface of the substrate, equal to or larger than the substrate in the plan size.

5. A substrate processing apparatus for performing predetermined processing by supplying a processing liquid to a substrate while rotating the substrate, the apparatus comprising:
   a substrate-supporting unit which holds the substrate;
   a rotary driving unit which rotates the substrate held by the substrate-supporting unit;
   a nozzle which supplies the processing liquid to a top rim portion of the rotating substrate;
   a blocking member which is disposed opposing a top surface of the substrate and includes a through hole which vertically penetrates a rim portion of the blocking member and which includes a shape allowing the nozzle to be inserted into the through hole, the rim portion being positioned inwardly from a surface of an edge of the blocking member;
   a nozzle move mechanism which moves the nozzle between an opposing position and a retract position, the opposing position being a position at which the nozzle opposes the top rim portion of the substrate by being inserted into the through hole, the retract position being a position which is away from the blocking member; and a controller which is configured to cause the nozzle to supply the processing liquid to the top rim portion of the substrate when the nozzle is positioned to the opposing position, wherein the blocking member has an opposing surface which faces opposing to the top surface of the substrate, and wherein the substrate-supporting unit comprises: a rotary member which is structured to rotate freely about a vertical axis; at least three supporting members each of which is disposed upward on the rotary member and abuts on the bottom surface of the substrate to thereby support the substrate with a distance from the rotary member; and a gas supplying part which has a gas ejection outlet that is disposed on the opposing surface of the blocking member and which supplies gas from the gas ejection outlet to a space between the opposing surface of the blocking member and the top surface of the substrate to press the substrate against the supporting members so that the substrate is held by the substrate-supporting unit.

6. The substrate processing apparatus of claim 5, further comprising a gas ejection unit which ejects gas from the through hole when the nozzle is positioned to the retract position, wherein the blocking member has a gas introduction inlet which is disposed on the inner wall of the through hole and is communicated with the gas supplying part, and the gas ejection unit ejects gas from the through hole by introducing the gas supplied from the gas supplying part to an inside of the through hole via the gas introduction inlet.

7. The substrate processing apparatus of claim 5, wherein the gas ejection outlet is so constructed and arranged that the gas is supplied to a non-processing area which is located on an inner side relative to a processing area which is within the top surface of the substrate and is processed with the processing liquid which is supplied from the nozzle to the substrate.

8. A substrate processing method of performing predetermined processing by supplying a processing liquid to a substrate while rotating the substrate, the method comprising the steps of:

disposing a blocking member opposing a top surface of the substrate, the blocking member having a through hole that vertically penetrates a rim portion of the blocking member and has a shape such that a nozzle can be inserted into the through hole, the rim portion being positioned inwardly from a surface of an edge of the blocking member;

moving a nozzle between a retract position and an opposing position, the opposing position being a position at which the nozzle opposes to the top rim portion of the substrate by being inserted into the through hole, the retract position being a position which is away from the blocking member;

supplying the processing liquid from the nozzle when the nozzle is positioned at the opposing position to the top rim portion of the substrate that is rotating; and ejecting gas from the through hole when the nozzle is positioned at the retract position.

9. A substrate processing method of performing predetermined processing by supplying a processing liquid to a substrate while rotating the substrate, the method comprising the steps of:

disposing a blocking member opposing a top surface of the substrate, the blocking member having a through hole that vertically penetrates a rim portion of the blocking member and has a shape such that a nozzle can be inserted into the through hole, the rim portion being positioned inwardly from a surface of an edge of the blocking member;

moving a nozzle between a retract position and an opposing position, the opposing position being a position at which the nozzle opposes to the top rim portion of the substrate by being inserted into the through hole, the retract position being a position which is away from the blocking member;

supplying the processing liquid from the nozzle when the nozzle is positioned at the opposing position to the top rim portion of the substrate that is rotating; and supplying gas from a gas ejection outlet that is disposed on an opposing surface of the blocking member to a space between the opposing surface of the blocking member and the top surface of the substrate to press the substrate against at least three supporting members so that the substrate is held, the opposing surface of the blocking member facing opposing to the top surface of the substrate, the rotary member being structured to rotate freely about a vertical axis, each of the supporting members being disposed upward on the rotary member and abutting on a bottom surface of the substrate to support the substrate at a distance from the rotary member.

* * * * *